United States Patent [19]

Felten

[11] 4,414,143

[45] Nov. 8, 1983

[54] CONDUCTOR COMPOSITIONS

[75] Inventor: John J. Felten, Lewiston, N.Y.

[73] Assignee: E. I. Du Pont de Nemours & Co., Wilmington, Del.

[21] Appl. No.: 260,608

[22] Filed: May 6, 1981

[51] Int. Cl.³ ............................................. H01B 1/02
[52] U.S. Cl. .................................. 252/514; 252/518; 252/519; 106/1.13; 106/1.14; 106/1.15; 428/432; 428/434
[58] Field of Search ............... 252/514, 512, 513, 518, 252/519; 106/1.13, 1.14, 1.16, 1.15, 1.21, 47 R; 428/432, 433, 434, 209, 210, 901

[56] References Cited

U.S. PATENT DOCUMENTS

| | | | |
|---|---|---|---|
| 3,763,409 | 10/1973 | Sheard | 317/258 |
| 3,838,071 | 9/1974 | Amin | 252/514 |
| 4,001,146 | 1/1977 | Horowitz | 252/514 |
| 4,090,009 | 5/1978 | Horowitz | 252/514 |

Primary Examiner—Josephine Barr

[57] ABSTRACT

Palladium/silver metallizations having excellent solderability and aged adhesion are obtained by substituting for the palladium copper and/or certain transition metals or binary metal oxides and concommitantly reducing the amount of inorganic binder.

9 Claims, No Drawings

CONDUCTOR COMPOSITIONS

FIELD OF THE INVENTION

The invention is related to thick film conductor compositions and particularly to solderable noble metal conductors.

BACKGROUND OF THE INVENTION

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in *Handbook of Materials and Processes for Electronics*, C. A. Harper, Editor, McGraw-Hill, N.Y., 1970, Chapter 12.

The most commonly used conductor compositions employ noble metals, especially gold, silver, platinum, palladium, and their mixtures and alloys, since their relatively inert characters permits firing in air. Attempts at using dispersions of less expensive non-noble metals have often been confined to specialized uses or have required the great practical inconvenience and expense of firing in nonoxidizing atmospheres (nitrogen, nitrogen/hydrogen, hydrogen, argon, etc.)

Conductor compositions are used in the microcircuit industry to "terminate" resistor patterns, typically by firing the conductor pattern on a substrate and then printing resistor patterns over part of the conductor pattern and firing.

PRIOR ART

The prior art on conductor compositions includes the use of glass binders. U.S. Pat. No. 3,293,501 to Martin discloses conductive films of glasses comprising copper and bismuth oxides. U.S. Pat. No. 3,776,769 to Buck discloses compositions of noble metal, copper oxide and glass, which is fireable in reducing atmospheres.

Other related prior art includes U.S. 3,617,785 to Kristiansen which is directed to a commutator brush alloy containing 50-70% wt. silver, 25-40% wt. palladium and 3-10% wt. copper metal. U.S. Pat. No. 3,763,409 to Sheard discloses palladium metallizations comprising finely divided copper or copper oxide and palladium in which the ratio of copper to palladium is no more than 2.5 and the content of other noble metals, such as silver, is no more than 50%. These materials are fired in two stages at temperatures of 600°-1400° C. In U.S. No. 3,838,071 to Amin, palladium/silver metallizations are disclosed which contain polynary oxides of copper which melt above 1000° C. and are alleged to have improved substrate adhesion. Larry, in U.S. Pat. No. 3,843,350, discloses air-fireable conductor compositions comprising finely divided silver and coprecipitated palladium/copper alloy particles. The palladium/copper alloy contains 35-75% wt. palladium and the ratio of alloy to silver is 0.1-0.5. It is disclosed that the alloy particles give better aged adhesion than particles of the separate materials.

In Smith et al., U.S. Pat. No. 3,918,980 a metallization is disclosed comprising in finely divided form 1-6 parts (by weight) cadmium oxide and copper oxide, 1-8 parts palladium, 0.2-3 parts ruthenium oxide, at least 73 parts silver and 10-60% by weight, basis metal, of inorganic binder. In its most nearly pertinent aspect, U.S. Pat. No. 4,001,146 to Horowitz discloses a silver conductor composition containing either silver/palladium or silver/palladium/copper alloys and 1-5% by weight of a crystalline inorganic binder containing bismuth oxide and copper oxide. The ratio of silver to other metals is at least 17. Similarly, in U.S. Pat. No. 4,105,828, Borchart et al. disclose for use in three-layer contact structures for relays a conductive layer comprising an alloy of silver/palladium/copper. The alloys contain 10-50% weight palladium. Copper is disclosed as one component of a preferred alloy composition having a composition of 65/30/5 silver/palladium/copper. In addition, U.S. Pat. No. 4,090,009 to Horowitz discloses palladium/silver compositions comprising finely divided particles of palladium and an inorganic binder containing bismuth-free glass and a polynary oxide. The maximum ratio of silver to palladium is 15.

From the foregoing summary of the most pertinent prior art, it is apparent that considerable work has been directed to palladium/silver conductors and to the inclusion of other materials therein. In part, this has been due to the high cost of noble metals and the economy which can be affected by substitution of less expensive base metals. Also, this has been due to the shortcomings of palladium/silver conductors. In particular, most palladium/silver conductors do not have good enough resistance to solder leaching or good enough adhesion to the substrate upon aging, without aging, without high concentrations of expensive palladium and/or platinum.

SUMMARY OF THE INVENTION

The invention is therefore directed to a palladium/silver metallization for use in the manufacture of printed conductors which, by the inclusion of certain base metals and base metal compounds, have improved resistance to solder leaching and also improved aged adhesion with reduced levels of palladium. In particular the invention is directed to an improved metallization for the manufacture of printed conductors which is an admixture of finely divided particles of metallic materials comprising by weight 40-70 parts silver metal, 1-25 parts palladium metal and 1-25 parts of first series transition metals or transition metal binary oxides such as copper metal, copper oxide, cobalt oxide, nickel oxide or mixtures thereof. The weight ratio (a) of silver to palladium is above 2.5, (b) of base metal to palladium is from 1.5 to 0.05, (c) of base metal to inorganic binder is from 0.1 to 1.75 and (d) the sum of base metal material and inorganic binder is no more than 18 parts by weight.

In a further aspect the invention is directed to screen-printable paste comprising 82-97% by weight of the above-described metallization and 3-18% by weight finely divided particles of inorganic binder materials dispersed in organic medium. Still further, the invention is directed to conductive elements comprising a nonconductive ceramic substrate having a conductive pattern affixed thereon formed by printing a pattern of the above-described screen printable paste and firing the printed substrate to effect volatilization of the organic medium and sintering of the inorganic binder and metallization. In yet another aspect, the invention is directed to a process for making conductors comprising (a) applying a patterned thick film of the above-described screen printable paste to a nonconductive ceramic substrate, (b) drying the film at a temperature below 200° C. and (c) firing the dried film at a temperature below about 1050° C. to effect sintering of the inorganic binder and metallization.

DETAILED DESCRIPTION OF THE INVENTION

A. Conductive Material

The finely divided metals used in the invention can be any of those which are commercially available for use in thick film conductors and the metal oxides can be a reagent grade. The particle size of the above-described metallic materials is not narrowly critical from the standpoint of their technical effectiveness in the invention. However, they should, of course, be of a size appropriate to the manner in which they are applied, which is usually screen printing, and to the firing conditions. Thus the metallic material should be no bigger than 10 $\mu$m and preferably should be below about 5 $\mu$m. As a practical matter, the available particle size of the metals is as low as 0.1 $\mu$m for palladium and from 0.1 to 10 $\mu$m for silver. The metallic oxides can be readily reduced in particle size by ball milling if necessary.

As mentioned hereinabove, the proportions of the metallic component, i.e., metal and/or metal oxides, on a weight basis are 40–70 parts silver, 1–25 parts palladium metal and 1–25 parts base metal or base metal binary oxide, as the case may be, with the weight ratio of silver to palladium being at least 2.5 the ratio of base metal or its oxide to palladium being 1.5–0.05 and the ratio of base metal or its oxide to inorganic binder being 0.1–1.5. Preferred proportions are 45–70 parts silver, 5–17 parts palladium and 1–6 parts base metal or base metal oxide. A particularly preferred composition which is the best mode known at the time of filing has the proportions of 49.6 parts silver, 10.6 parts palladium, 6.0 parts copper oxide and 1.0 part nickel oxide.

A suitable base metal is copper, but suitable base metal oxides include binary oxides such as CuO, CoO, and NiO as well. Mixtures of these materials can be used as well. Polynary oxides of these metals are not suitable, however.

B. Inorganic Binder

Suitable inorganic binders are those conventional materials which upon sintering serve to bind metal to ceramic substrates, such as glasses, certain metal oxides and glass precursors. Conventional glass frits such as lead borates, lead silicates, lead borosilicates, cadmium borate, lead cadmium borosilicates, zinc borosilicates and sodium cadmium borosilicates may be used. However, a glass having a high content of bismuth oxide is preferred. Such high bismuth glass contains at least 50% by weight bismuth oxide and preferably at least 70%. Typical of such high bismuth glasses is the following glass composition which is used in the examples hereinbelow and is preferred. The materials are fritted in an appropriate furnace by methods well-known in the art and then ground in ball mills to a particle size of about 0.5–5 $\mu$m. The preferred glass binder mentioned above, which is used in the following examples, has the following composition:

| $Bi_2O_3$ | 72.4% wt. | $TiO_2$ | 4.2% wt. |
| PbO | 10.7 | $H_3BO_3$ | 2.1 |
| $SiO_2$ | 9.0 | $Al_2O_3$ | 1.6 |

Alternatively, a mixture of glass and bismuth oxide can be used in place of bismuthate glass, for example as shown in Experiment 5. This glass has the following composition:

| $CaCO_3$ | 5.31% wt. | $Na_2CO_3$ | 11.12% wt. |
| $BaCO_3$ | 0.84 | PbO | 0.50 |
| ZnO | 20.75 | $Al_2O_3.3H_2O$ | 6.50 |
| $SiO_2$ | 16.31 | $ZrO_2$ | 3.0 |
| $H_3BO_3$ | 35.68 | | |

C. Organic Medium

The inorganic particles are mixed with an inert liquid vehicle by mechanical mixing (e.g., on a roll mill) to form a paste-like composition having suitable consistency and rheology for screen printing. The latter is printed as a "thick film" on conventional dielectric substrates in the conventional manner. Any inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineol and the like, solutions of resins such as the polymethacrylates of lower alcohols, or solutions of ethyl cellulose in solvents such as pine oil, and the monobutyl ether of ethylene glycol monoacetate. The vehicle may contain volatile liquids to promote fast setting after application to the substrate.

The ratio of vehicle to solids in the dispersions may vary considerably and depends upon the manner in which the dispersion is to be applied and the kind of vehicle used. Normally to achieve good coverage the dispersions will contain complementally, 60–90% solids and 10–40% vehicle. The compositions of the present invention may, of course, be modified by the addition of other materials which do not affect its beneficial characteristics. Such formulation is well within the skill of the art.

D. Formulation and Application

In the preparation of the composition of the present invention, the particulate inorganic solids are mixed with the organic carrier and dispersed with suitable equipment, such as a three-roll mill, to form a suspension, resulting in a composition for which the viscosity will be in the range of about 100–300 pascal-seconds at a shear rate of 4 sec$^{-1}$.

In the examples which follow, the formulation was carried out in the following manner:

The ingredients of the paste, minus 3% of the organic components, are weighed together in a container. The components are then vigorously mixed to form a uniform blend; then the blend is passed through dispersing equipment, such as a three roll mill, to achieve a good dispersion of particles. A Hegman gauge is used to determine the state of dispersion of the particles in the paste. This instrument consists of a channel in a block of steel that is 25$\mu$ deep (1 mil) on one end and ramps up to 0" depth at the other end. A blade is used to draw down paste along the length of the channel. Scratches will appear in the channel where agglomerates' diameter is greater than the channel depth. A satisfactory dispersion will give a fourth scratch point of 10–18μ typically. The point at which half of the channel is uncovered with a well dispersed paste is between 3 and 8μ typically. Fourth scratch measurement of >20μ and "half-channel" measurements of >10 μm indicate a poorly dispersed suspension.

The remaining 3% consisting of organic components of the paste is then added, adjusting the resin content to bring the viscosity when fully formulated to between 180 and 250 Pa.s., typically.

The composition is then applied to a substrate, such as alumina ceramic, usually by the process of screen printing, to a wet thickness of about 30–80 microns, preferably 35–70 microns, most preferably 40–50 microns. The printed pattern is then dried at about 80°–150° C. for about 5–15 minutes. Firing to effect sintering of the inorganic binder as well as the finely divided particles of metal is preferably done in a well ventilated belt conveyor furnace with a temperature profile that will allow burnout of the organic matter at about 300°–600° C., a period of maximum temperature of about 800°–950° C. lasting about 5–15 minutes, followed by a controlled cooldown cycle to prevent oversintering, unwanted chemical reactions at intermediate temperatures, or substrate fracture from too rapid cooldown. The overall firing procedure will preferably extend over a period of about 1 hour, with 20–25 minutes to reach the firing temperature, about 10 minutes at the firing temperature, and about 20–25 minutes in cooldown.

The fired thickness of the conductor can range from about 6 to about 15 microns, depending on the percent solids, the type of screen the composition is printed with, the printer setup, and the degree of sintering of the inorganic solids.

E. Test Procedures

Aged Adhesion:

The adhesion after thermal aging is determined as follows. Parts are printed on 96% alumina substrates such as Alsimag ® 614. (Tradename of 3M Company, Minneapolis, Minn., for aluminum magnesium silicon oxides.) The screen used generally is a 200 mesh screen with 1.6–2.1 mil diameter stainless steel mesh. The wire is mounted so that the mesh wires run parallel to the frame of the screen. The pattern is defined by a pattern photoimaged on an emulsion applied to the mesh and developed chemically to form a stencil through which the thick film paste is applied to the substrate. The pattern for the adhesion test has 9 pads each 80 mils square, arranged to form a 3×3 grid of pads on a 1"×1" substrate. The photographic emulsion generally extends 0.5–1.0 mil below the wire mesh on the bottom of the screen to allow a thicker print and to seal off the pattern at the substrate surface to provide better resolution. The screen printer is generally set to have a 25 mil gap between the screen and the substrate to be printed upon.

The squeegee that forces paste through the stencil is made of hard rubber or a synthetic material such as Viton ® fluoro elastomer of 50–90 durometer hardness rating. (Viton is a registered trademark of E. I. du Pont De Nemours and Company, Inc., Wilmington, Delaware). Downward pressure, typically about 1 pound per inch of squeegee length, is exerted on the squeegee. The squeegee sweeps ink across the pattern at 3–10 inches/second typically.

The printed parts are dried 5–15 minutes at 80–150 degrees Celsius. They are then fired four times in a belt furnace which has a 10 minute peak temperature cycle at 850° C., plus a 20 minute ramp of increasing temperature from room temperature to the maximum of 850; and a 30 minute descending temperature ramp back down from 850° to ambient.

After firing four times the parts have wires attached as follows. Wires are clipped onto the substrate so that they each run down the center of three pads. Then the wires/fired parts are dipped into Alpha 611 solder flux. The parts are then prewarmed on the solder bath and dipped for 10 seconds, and allowed to cool. Residual solder flux is cleaned from the soldered wired parts with a $CH_2Cl_2$/methanol mixture. Parts are placed in an oven at 150° for 72 hours, then removed and cooled.

The aged parts are placed in an apparatus for measuring the force necessary to separate the wire from the substrate. The force necessary is recorded. Also, the type of separation is noted, i.e., whether separation involves the wire pulling out of the solder pulls off the substrate. Over 15 Newtons is good adhesion. Over 20 Newtons is excellent adhesion. Adhesion of 12–14 Newtons is marginal and below 12 is unacceptable. Solderability:

Using a paste formulated in the manner described above, a 200 square serpentine pattern having 20 mil wide lines and spaces is screen printed upon a 96% alumina substrate (Alsimag ® 614) and then dried and fired in the manner described above for the aged adhesion test. The printed and fired substrate is dipped into solder flux (Alpha 611) to coat the substrate. The fluxed substrate is then heated briefly (Ca. 2 seconds) over a solder pot which contains 62/36/2 Sn/Pb/Ag solder heated to 220° C. After heating, the substrate is immersed into the solder for five seconds, removed and rinsed with a solution of methanol and methylene chloride. The solderability of the substrate is then evaluated by visual examination using the following criteria:

| Excellent (E) | Total coverage | 100% Solder area |
|---|---|---|
| Very good (V) | Few pinholes in pattern | 98–99% |
| Good (G) | Few pinholes in pattern plus 1 or 2 unsoldered areas on the pads | 96–97% |
| Fair (F) | Several unsoldered areas on the pads | 92–95% |
| Poor (P) | 10% or more unsoldered | ≦90% |

EXAMPLES

The following examples graphically illustrate the invention and its advantages. All compositions described in the examples were formulated, applied and tested in the manner described hereinabove. All proportions are given in percentage by weight unless otherwise indicated.

EXAMPLE 1

A series of palladium/silver metallizations was prepared in the manner described above in which part of the palladium was substituted with copper metal and increasing amounts of silver were used. Solderability and aged adhesion data are given in Table 1 below.

TABLE 1

|  | Control | \multicolumn{5}{c}{Experiment No.} |  |  |  |  |
|---|---|---|---|---|---|---|
|  |  | 1 | 2 | 3 | 4 | 5 |
| Composition (parts by wt) | | | | | | |
| Cu | — | 5.0 | 5.0 | 5.0 | 5.0 | 5.0 |
| NiO | 0.8 | 0.8 | 0.8 | 0.8 | 0.8 | 0.8 |
| Pd | 16.6 | 11.6 | 11.6 | 11.6 | 11.6 | 11.6 |
| Ag | 43.4 | 43.4 | 45.9 | 48.4 | 50.9 | 53.4 |
| Glass | 14.2 | 14.2 | 11.7 | 9.2 | 6.7 | 4.2 |
| Solderability (Visual Rating) | | | | | | |
| 62/36/2 Sn/Pb/Ag | E | P | P | V | V | E |
| 63/37 Sn/Pb | E | P | P | P | V | E |
| Aged Adhesion After 4 Firing Cycles (Newtons) | | | | | | |
| Initial | 31.4 | 25.7 | 30.8 | 33.1 | 31.4 | 33.2 |
| 48 hrs. | 26.0 | 15.2 | 21.9 | 24.4 | 26.5 | 28.3 |
| 250 hrs. | 27.8 | 16.3 | 22.2 | 23.3 | 25.1 | 27.1 |
| 1000 hrs. | 28.5 | 16.7 | 22.0 | 23.9 | 24.3 | 24.6 |

The above data show graphically that a substantial part of the quite expensive palladium can be substituted with base metals or their oxides so long as the total of base metal and glass binder does not exceed 18 parts by weight. Concomitantly, the amount of silver must be increased as well. However, a 22% reduction in noble metal content is obtained without any significant loss of either solderability or aged adhesion.

EXAMPLE 2

To illustrate the interaction of the base metal and the palladium, a series of metallizations was made in which the binder component was omitted. These data, which are given in Table 2 below, show that the system requires at least a small amount of palladium in combination with the base metal to insure good solderability

TABLE 2

|  | \multicolumn{8}{c}{Experiment No.} | | | | | | | |
|---|---|---|---|---|---|---|---|---|
|  | 6 | 7 | 8 | 9 | 10 | 11 | 12 | 13 |
| Composition (parts by wt) | | | | | | | | |
| Cu | 2 | 4 | 4 | 4 | 6 | 10 | 10 | 20 |
| Pd | 2 | 2 | 4 | — | — | 10 | — | — |
| Ag | 76 | 74 | 72 | 76 | 74 | 60 | 70 | 60 |
| Solderability (Visual Rating) | | | | | | | | |
| 62/36/2 Sn/Pb/Ag | E | V | V | P | P | E | P | P |

EXAMPLE 3

A series of three metallizations was prepared and tested in which substantially varying ratios of silver to palladium were used. Upon testing for both solderability and aged adhesion, it is apparent that the ratio of silver to palladium is not critical down to a ratio of below 4. In addition, the importance of reducing the glass level when copper is used can be seen by comparing Experiment No. 15 with Experiment No. 16. It is apparent that, were the total of glass and copper significantly to exceed 18 parts by weight, solderability would be adversely affected. These data are presented in Table 3 below.

TABLE 3

|  | \multicolumn{3}{c}{Experiment No.} | | |
|---|---|---|---|
|  | 14 | 15 | 16 |
| Composition (parts by wt) | | | |
| Cu | 2.0 | 5.0 | 5.0 |
| Pd | 17.0 | 8.2 | 5.0 |
| Ag | 49.0 | 58.7 | 64.0 |
| Glass | 10.0 | 4.0 | 10.0 |
| Solderability (Visual Rating) | | | |
| 62/36/2 Sn/Pb/Ag | E | E | E |

EXAMPLE 4

A further series of three metallizations was prepared in which copper oxide, nickel oxide and copper metal were used. These metallizations were tested for both solderability and aged adhesion. As shown in Table 4 below, all three base metal components gave excellent solderability. Though the copper oxide was less effective for adhesion than the copper metal, the addition thereto of only a small amount of nickel oxide was sufficient to raise the 48 hour adhesion value above that of copper metal alone.

TABLE 4

|  | \multicolumn{3}{c}{Experiment No.} | | |
|---|---|---|---|
|  | 17 | 18 | 19 |
| Composition (parts by wt) | | | |
| CuO | — | 6.0 | 6.0 |
| Cu | 6.0 | — | — |
| NiO | — | — | 1.0 |
| Pd | 10.6 | 10.6 | 10.6 |
| Ag | 53.4 | 53.4 | 53.4 |
| Glass | 4.0 | 4.0 | 4.0 |
| Solderability (Visual Rating) | | | |
| 62/36/2 Sn/Pb/Ag | E | E | E |
| Aged Adhesion (Newtons) | | | |
| 48 hrs. | 18.7 | 13.7 | 21.3 |

EXAMPLE 5

A further series of metallizations was prepared in which the effect of cobalt oxide, nickel oxide, and zinc oxide on solderability and adhesion after multiple fires and thermal aging were tested. Nickel oxide gave excellent solderability and adhesion, zinc oxide gave excellent solderability and good adhesion, cobalt oxide yielded fair solderability and poor adhesion.

TABLE 5

|  | \multicolumn{3}{c}{Experiment No.} | | |
|---|---|---|---|
|  | 20 | 21 | 22 |
| Composition (parts by wt) | | | |
| Ag | 57.0% | 55.2% | 57.2% |
| CoO | — | — | 4.0 |
| NiO | — | 6.0 | — |
| ZnO | 6.0 | — | — |
| Pd | 6.0 | 7.8 | 7.8 |
| Glass | 1.5 | 1.5 | 1.5 |
| $Bi_2O_3$ | 4.5 | 4.5 | 4.5 |
| Solderability (Visual Rating) | | | |
| 62/36/2 Sn/Pb/Ag | E | E | F |

TABLE 5-continued

| | Experiment No. | |
|---|---|---|
| 20 | 21 | 22 |
| Adhesion After Multiple Fires and Thermal Aging | | |
| 15.5 (68 hrs aging) | 35.5 (70 hrs aging) | 7.5 (70 hrs aging) |

I claim:

1. A palladium/silver metallization suitable for the manufacture of printed conductors which is an admixture of
   A. 82-97% by weight of finely divided particles of metallic materials comprising by weight
      (1) 40-70 parts silver metal;
      (2) 1-25 parts palladium metal; and
      (3) 1-25 parts of a base metal material selected from the group consisting of copper metal, copper oxide, cobalt oxide, nickel oxide and mixtures thereof; and
   B. 3-18% by weight finely divided particles of inorganic binder dispersed in organic medium, in which admixture the weight ratio of silver to palladium is greater than 2.5, the weight ratio of base metal material to palladium is 0.05-1.5, the weight ratio of base metal material to inorganic binder is 0.1-1.75 and the sum of base metal material and inorganic binder is no more than 18 parts by weight.

2. The metallization of claim 1 in which the silver metal content is 45-70 parts by weight.

3. The metallization of claim 1 in which the palladium content is 3-17 parts by weight.

4. The metallization of claim 1 in which the base metal material content is 1-6 parts by weight.

5. The metallization of claim 1 in which the metallic materials contain by weight 49.6 parts silver, 10.6 parts palladium, 6.0 parts copper oxide, and 1.0 part nickel oxide.

6. The metallization of claim 1 in which the inorganic binder is high bismuth glass or a mixture of glass and bismuth oxide.

7. The metallization of claim 5 in which the glass binder contains at least 50% by weight bismuth oxide.

8. A conductive layer comprising a thick film of the composition of claim 1 which has been fired to remove the organic medium and to effect sintering of the inorganic binder and metallization.

9. A printed conductor element comprising a thick film of the composition of claim 1 printed upon an inorganic substrate which has been fired to remove the organic medium and to effect sintering of the inorganic binder and metallization.

* * * * *